United States Patent
Sit

(10) Patent No.: US 7,295,955 B2
(45) Date of Patent: Nov. 13, 2007

(54) COMPUTER-ASSISTED EVALUATION OF BLUEPRINTS USING COMPUTER-STORABLE EVALUATION-CRITERIA

(75) Inventor: Ho Wing Sit, Moraga, CA (US)

(73) Assignee: Accela, Inc., Dublin, CA (US)

( * ) Notice: Subject to any disclaimer, the term of this patent is extended or adjusted under 35 U.S.C. 154(b) by 0 days.

(21) Appl. No.: 11/215,562

(22) Filed: Aug. 29, 2005

(65) Prior Publication Data

US 2006/0136179 A1 Jun. 22, 2006

Related U.S. Application Data

(60) Provisional application No. 60/637,017, filed on Dec. 17, 2004.

(51) Int. Cl.
*G06F 17/50* (2006.01)

(52) U.S. Cl. .................. 703/1; 707/2; 707/3; 715/501.1

(58) Field of Classification Search .............. 703/1; 707/2, 3, 104.1; 715/501.1, 502
See application file for complete search history.

(56) References Cited

U.S. PATENT DOCUMENTS

| | | | |
|---|---|---|---|
| 5,526,520 A * | 6/1996 | Krause ..................... | 707/104.1 |
| 5,625,827 A * | 4/1997 | Krause et al. .............. | 715/502 |
| 5,907,850 A * | 5/1999 | Krause et al. ............ | 715/501.1 |
| 6,922,701 B1 * | 7/2005 | Ananian et al. .......... | 707/104.1 |

OTHER PUBLICATIONS

"A Short History of the IAI and the IFC Information Mode," International Alliance for Interoperability, http://www.iai-international.org/About/History.html, 2 pages.
"Specification of IfcPropertyTypeResource_151," http://www.iai-international.org/Model/documentation/R151/Online_Documents/documen . . . , pp. 1-14.
"Computer-aided design," Wikipedia, the free encyclopedia, http://en.wikipedia.org/wiki/CAD, pp. 1-7.

* cited by examiner

*Primary Examiner*—Russell Frejd
(74) *Attorney, Agent, or Firm*—Beyer Weaver LLP

(57) ABSTRACT

Techniques for representing criteria for blueprints as computer-readable expressions, and evaluating blueprints based on computer-storable (or readable) expressions are disclosed. A computer-storable expression can be constructed based on one or more functions, parameters and operators stored in respective libraries. A dynamic blueprint-evaluator can interactively evaluate a blueprint as the blueprint is generated (e.g., drawn) and/or altered. The dynamic blueprint-evaluator evaluates computer-storable expressions that represent various criteria for the blueprint and can indicate when a criterion has not been meet (e.g., highlight a plan or a drawing). The dynamic blueprint-evaluator can be implemented as or as a part of software used to generated blueprints (e.g., CAD), thereby allowing blueprints to be automatically and dynamically evaluated using a computer.

56 Claims, 14 Drawing Sheets

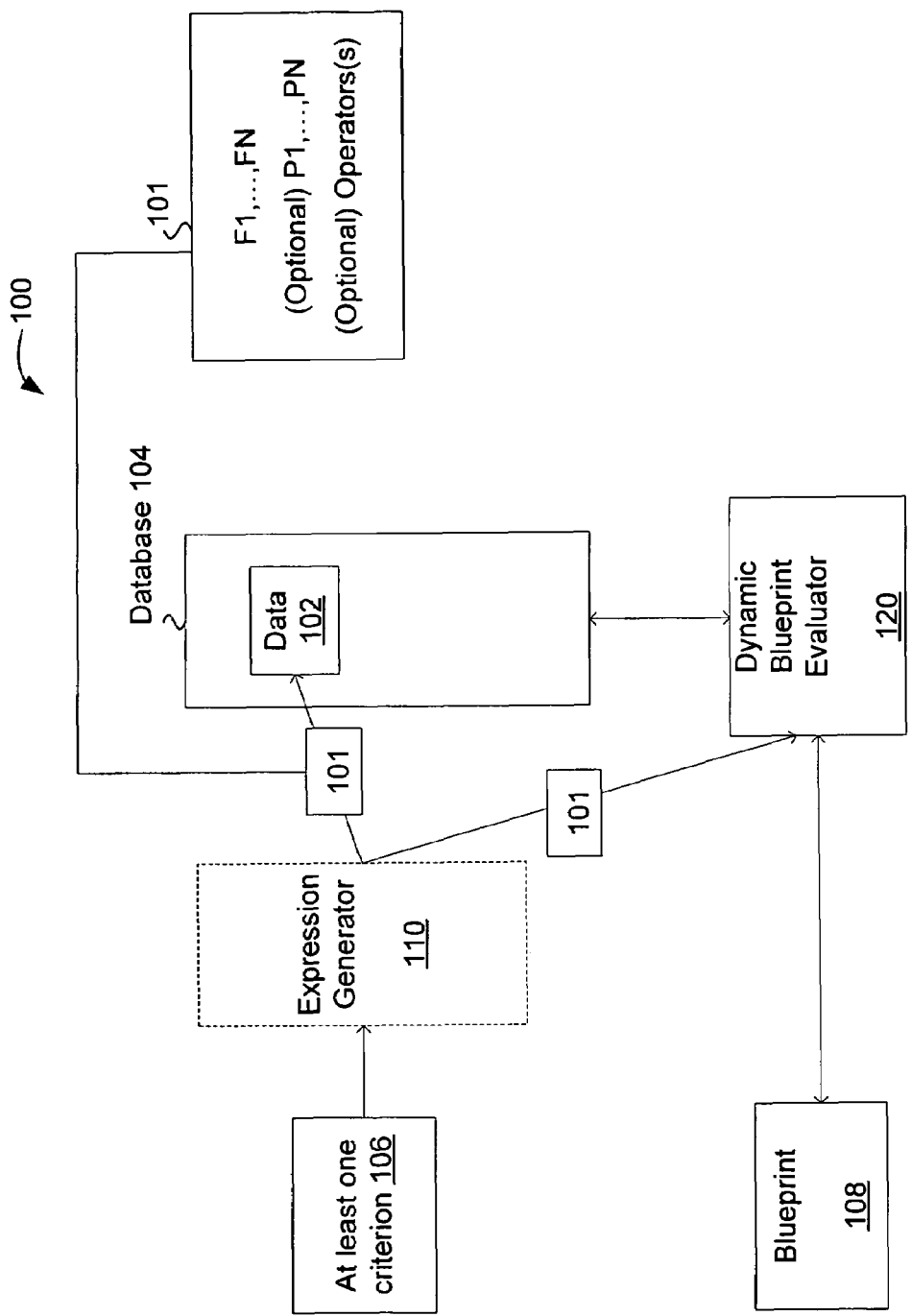

Functions Library

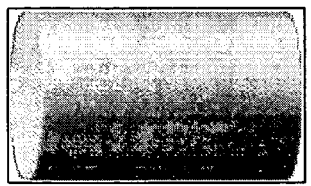

Functions Library

Determining exit travel Distance
Determining interior versus exterior
Determining enclosure
Determining discharge volume
Determining occupant load
Determining door opening into path
Determining width
Determining height
Determining illumination
Determining size
Determining swing
Determining elevation
Determining locks & latches Determining treads and risers
Determining type of construction
Determining building element
Determining building element ratings
Determining building area
Determining structural member
Determining structural member ratings
Determining structural member assembly
Determining wall
Determining wall type
Determining wall rating
Determining wall penetration
Determining smoke barrier

| Distance Function for | Type | Maximum Allowable Distance | Unit of Measurement |
|---|---|---|---|
| Exit Travel Distance | Exterior exit doors at ground level | 150 | Feet |
| Exit Travel Distance | Vertical exit enclosures | 75 | Feet |
| Exit Travel Distance | Exit passageways | 100 | Feet |
| Exit Travel Distance | Exterior exit stairways/ramps | 150 | Feet |

322

340

| Distance Function for | Type | Actual Distance from BIM | Unit of Measurement | Object # |
|---|---|---|---|---|
| Exit Travel Distance | Exit passageways | 125 | Feet | DR345 |
| Exit Travel Distance | Exit passageways | 72 | Feet | DR346 |
| Exit Travel Distance | Exit passageways | 95 | Feet | DR347 |
| Exit Travel Distance | Exit passageways | 150 | Feet | DR348 |
| Exit Travel Distance | Vertical exit enclosures | 145 | Feet | DR349 |
| Exit Travel Distance | Vertical exit enclosures | 80 | Feet | DR350 |
| Exit Travel Distance | Vertical exit enclosures | 95 | Feet | DR351 |
| Exit Travel Distance | Vertical exit enclosures | 45 | Feet | DR352 |

Fig. 3B

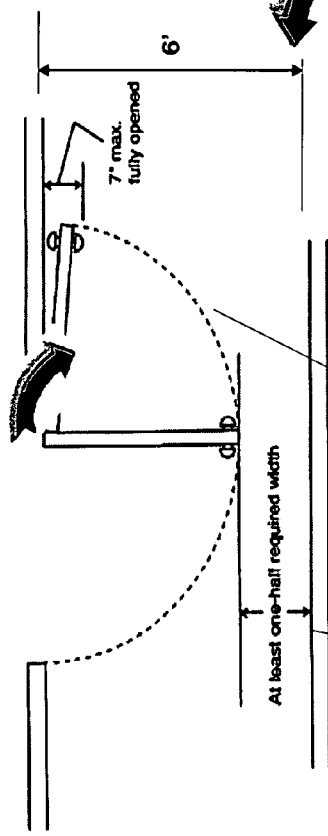

Code Compliance Review
ICC Section 1003.2.3
Egress Width
Dwelling units of Group R-2 and R-3, doors opening into the path of egress travel shall comply with the following

Project Design Parameter
All Corridor width for Project ABC shall be 6 feet minimum

Rules Library

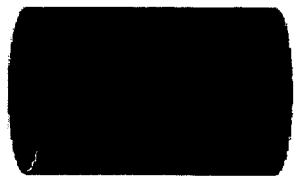

| Seq # | Rule Name | Function Name | Parameter Name | Operator |
|---|---|---|---|---|
| 001 | ICC Section 1003.2.3 | Type of construction Function | Dwelling Unit | = |
| 002 | ICC Section 1003.2.3 | Type of construction Function | R2 | OR |
| 003 | ICC Section 1003.2.3 | Type of construction Function | R3 | AND |
| 004 | ICC Section 1003.2.3 | Swing Function | Door | = |
| 005 | ICC Section 1003.2.3 | Swing Function | INTO EGRESS | AND |
| 006 | ICC Section 1003.2.3 | Width Function | Minimum Width | >= |
| 007 | ICC Section 1003.2.3 | Width Function | 3 Feet | END |

Distance between sprinklers for Type 1 Rating Fire Sprinkler must be 6 feet or less  402

Fig. 4A

Regulation X = (Function 1, Parameter 2) Operator 7
(Function 3, Parameter 5) Operator 8
(Function 4, Parameter 6) Operator 9

Fig. 4B

Regulation X = (TypeObject Function, Fire Sprinkler=Type 1) AND
(Shape Function, Ceiling = Flat) AND
(Distance Function, Fire Sprinkler to Fire Sprinkler
<= 6 feet)

Fig. 4C

| Sequence # | Rule Name | Function Name | Parameter Name | Operator |
|---|---|---|---|---|
| 001 | Rule X | TypeObject | Fire Sprinkler | = |
| 002 | Rule X | TypeObject | Type 1 | AND |
| 003 | Rule X | Shape | Ceiling | = |
| 004 | Rule X | Shape | Flat | AND |
| 005 | Rule X | Distance | Fire Sprinkler to Fire Sprinkler | <= |
| 006 | Rule X | Distance | 6 Feet | |

Fig. 4D

TYPE (Specification)

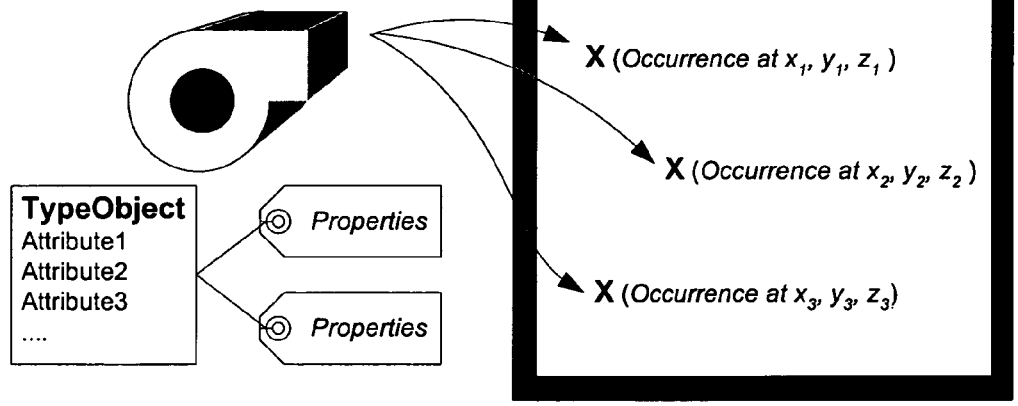

TypeObject
Attribute1
Attribute2
Attribute3
....

○ *Properties*

○ *Properties*

X (Occurrence at $x_1, y_1, z_1$)

X (Occurrence at $x_2, y_2, z_2$)

X (Occurrence at $x_3, y_3, z_3$)

Fig. 5B

Brackets and Fasteners Elements
Brackets, drop rods, steel
sections, bracket assemblies,
screws, bolts etc.

Fire Protection Elements
Sprinklers, hose reels, hydrants, wet/dry
rising mains

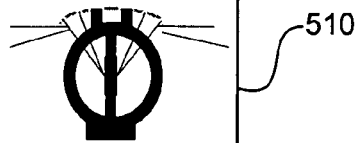 —510

Electrical Elements
Provision of switches, switchgear, power and
communication outlets, transformers, generators,
motors, conductors, protective devices,
distribution centres, light fittings

 —512

Fig. 5C

COMPUTER-ASSISTED EVALUATION OF BLUEPRINTS USING COMPUTER-STORABLE EVALUATION-CRITERIA

CROSS-REFERENCE TO RELATED APPLICATION

This application takes priority of the U.S. Provisional Patent Application No. 60/637,017, filed on Dec. 17, 2004, and entitled: "AUTOMATED SYSTEM FOR MANAGING COMPLIANCE WITH CODES, REGULATIONS AND PROJECT CRITERIA," which is hereby incorporated herein by reference in its entirety and for all purposes.

BACKGROUND OF THE INVENTION

A conventional blueprint (e.g., building or architectural plan) can be produced on paper by hand (e.g., using a pen or pencil to draw it on paper). With the advancements made in the computing field, however, it is possible today to use computers (e.g., Computerized Aid Design (CAD)) to generate very complex blueprints, for example, for building or architectural or other relatively complex blueprints.

Currently, CAD tools support two-dimensional (2D) blueprints. However, three-dimensional (3D) modeling is becoming more popular. Moving forward, three-dimensional (3D) models supported by CAD are likely to provide more than lines and dimensions. Such models can effectively provide the information needed for the full life-cycle of, for example, a building (or physical structure) from its "cradle to grave." Those skilled in the art may know several variations of three-dimensional (3D) models including, for example, Building Information Model (BIM), Virtual Buildings (VB), smart building, and object-oriented CAD. Typically, a three-dimensional (3D) model or techniques used to implement it provides elements (or objects) that can be used to generate a model. In a building or architectural plan, these elements can, for example, be (or represent) doors, windows, walls, or other structures that make a building. Generally, blueprints can be extremely complex. Building and architectural plans are a good example that illustrate the complexity of blueprints and are further discussed below.

Buildings are generally very complex. A building is made of numerous products typically provided by several suppliers and is ultimately completed as a result of the contribution of many professionals. Contracts between entities that participate in construction of a building are also primary based on CAD or hand-drawn plans. Recently, the building industry has introduced standards (e.g., Building Information Model (BIM)) in an attempt to improve the building (or construction) process and methods of commerce associated with the building process. These standard are, however, relatively new and still evolving. Currently, Industry Foundation Class (IFC) standard managed by the International Alliance for Interoperability (IAI) is the industry standard for the Building Information Model (BIM). Many countries have participated in creating IFC including the United States, Canada, UK, Germany, France, Italy, Finland, Norway, Sweden, Liberia, Japan, Singapore, and Korea. The list of countries adopting the IFC standard of IAI is growing. The IFC standard from IAI is certified by the ISO (International Standard Organization).

In the United States, building-safety (or construction-safety) is regulated by the state and/or local government building-codes. Because building-codes are complex, state and local governments generally do not create building-codes from scratch. Most state and local governments adopt a set of model building-codes and modify them as needed to meet their local needs. In the United States, there are two model building codes organizations: International Codes Council (ICC), and the National Fire Protection Association (NFPA).

SUMMARY OF THE INVENTION

Broadly speaking, the invention relates to: techniques for representing evaluation-criteria (e.g., building rule, regulation, or preference) associated with blueprints (e.g., building or architectural plans) as computer-readable expressions (or computer storable-expressions), and techniques for evaluating blueprints based on computer storable-expressions.

In accordance with one aspect of the invention, a computer-storable expression can be determined. The computer-storable expression (or storable-expression) represents and can effectively express at least one evaluation-criterion that can be associated with one or more blueprints. The storable-expression includes at least one function, but it can additionally include one or more parameters and/or operators. The functions, parameters and/or operators can be evaluated for a particular blueprint to determine whether the blueprint meets the criterion represented by the storable-expression. It will be appreciated, that general, abstract, generic or standard functions and parameters can be provided and stored, for example, in libraries in accordance with one embodiment of the invention. The functions and parameters can be interchangeably mixed and matched to construct various storable-expressions that represent various criteria (e.g., building rule, regulation, or preferences) for numerous types of blueprints (e.g., building or architectural plans). A storable-expression can also be stored in a library and subsequently used. In other words, functions can be used to represent various criteria (e.g., text-based building rules or regulations) as expressions that are stored in a computer readable medium (e.g., a database, a library). It will be also be appreciated that, among other things, model building codes can be easily modified and/or localized as storable-expressions.

Other aspects of the invention pertain to evaluating blueprints based on computer-storable expressions (storable-expressions). A blueprint-evaluator can be provided to evaluate blueprints in accordance with one aspect of the invention. In one embodiment, a dynamic blueprint-evaluator can interactively evaluate a blueprint as the blueprint is generated (e.g., drawn) and/or altered. The dynamic blueprint-evaluator evaluates computer-storable expressions that represent various criteria for the blueprint and can indicate when a criterion has not been meet (e.g., highlight a plan or a drawing). It will be appreciated that the dynamic blueprint-evaluator can be implemented as or as a part of software used to generated blueprints (e.g., a CAD tool), thereby allowing blueprints to be automatically and dynamically evaluated when a user (e.g., a human or application program) is in the process of creating or altering a blueprint. A dynamic blueprint-evaluator can, for example, be implemented as an interface or interface to software programs, applications or tools (e.g., a CAD). It is also possible to implement a blueprint-evaluator that adheres to a Building Information Model (e.g., IFC) and/or protocols (e.g., SML) that allow interoperability between diverse software and computing platforms (e.g., hardware and/or operating system).

It will be appreciated by those skilled in the art that the invention can be implemented in numerous ways, including as a method, an apparatus, a computer readable medium, a computer program, or a computer system. Several embodiments of the invention are discussed below.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, wherein like reference numerals designate like structural elements, and in which:

FIG. 1A depicts a computing environment in accordance with one embodiment of the invention.

FIG. 3A depicts exemplary functions suitable for enforcing building codes, government regulations, or other criteria related to a building plan.

FIG. 3B depicts a parameter matrix in accordance with one embodiment of the invention.

FIG. 3C depicts a storable-representation of a building rule that can correspond to a code compliance review of an ICC section.

FIGS. 4A-4D illustrate how a traditional text-based building code (or regulation) may be expressed, stored, and implemented in accordance with one embodiment of the invention.

FIGS. 5B-5D depict a few exemplary elements within the IFC model.

DETAILED DESCRIPTION OF THE INVENTION

Figure 1B:
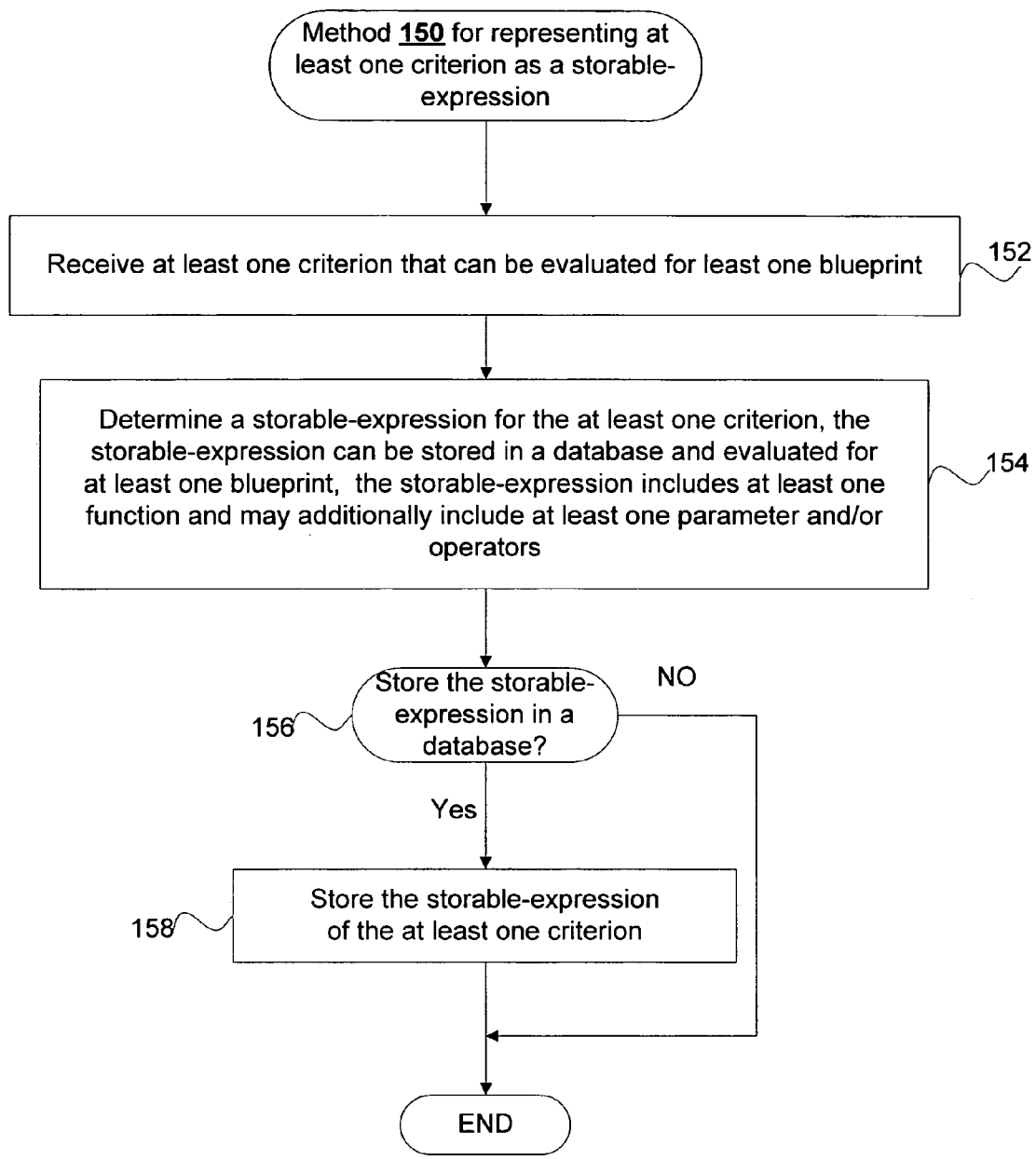
FIG. 1B depicts a method for representing at least one criterion as a storable-expression in accordance with one embodiment of the invention.

Broadly speaking a "blueprint" as used herein refers to a representation of one or more things (e.g., objects of an object-based programming). Typically, a blueprint can be presented (e.g., displayed) as a viewable representation. A "blueprint" can, for example, represent an idea, concept, plan, project, map, design, scheme, strategy, layout, schema, outline, or anything else capable of being represented typically as a viewable representation (e.g., building and architectural plans). Blueprints and/or the process for creating them can be very complex as, for example, demonstrated by the complexity of building and architectural plans. Furthermore, the process of generating and verifying that a blueprint (e.g., a building plan) meets various criteria (e.g., design criteria, building codes or regulation) can be extremely tedious, costly, error-prone, and long.

Today, there are about 44,000 government regulatory agencies. Each of these government regulatory agencies may have their own "localized" building codes and regulations. Every country in the world today may have its own building codes, model building organizations, and local regulatory organizations. Typically, a building or architectural plan has to be completed and then submitted for approval to one or more agencies that verify that various building codes or regulations have been satisfied. In addition, conventional building codes and regulations are text-based and require interpretation by a human being. The building plan is examined by a human being (e.g., by measuring various lengths and angles) to verify that various building codes and regulations have been meet. This process is tedious, inconsistent, error prone and expensive. Accordingly, improved techniques for evaluating blueprints would be highly useful. However, the diversity and complexity of building codes and regulations and the need to apply them locally present an extremely challenging problem.

Accordingly, the invention relates to: techniques for representing evaluation-criteria (e.g., building rule, regulation, or preference) associated with blueprints (e.g., building or architectural plans) as computer-readable expressions (or computer storable-expressions), and techniques for evaluating blueprints based on computer storable-expressions. It will be appreciated that the techniques, among other things, can be used to reduce the time and cost associated with generating and/or evaluating building or architectural plans.

In accordance with one aspect of the invention, a computer-storable expression can be determined. The computer-storable expression (or storable-expression) represents and can effectively express at least one evaluation-criterion that can be associated with one or more blueprints. The storable-expression includes at least one function, but it can additionally include one or more parameters and/or operators. The functions, parameters and/or operators can be evaluated for a particular blueprint to determine whether the blueprint meets the criteria represented by the storable-expression. It will be appreciated, that general, abstract, generic or standard functions and parameters can be provided and stored, for example, in libraries in accordance with one embodiment of the invention. The functions and parameters can be interchangeably mixed and matched to construct various storable-expressions that represent various criteria (e.g., building rule, regulation, or preferences) for numerous types of blueprints (e.g., building or architectural plans). A storable-expressions can also be stored in a library and subsequently used. In other words, functions can be used to represent various criteria (e.g., text-based building rules or regulations) as expressions that are stored in a computer readable medium (e.g., a database, a library).

Other aspects of the invention pertain to evaluating blueprints based on computer-storable expressions (storable-expressions). A blueprint-evaluator can be provided to evaluate blueprints in accordance with one aspect of the invention. In one embodiment, a dynamic blueprint-evaluator can interactively evaluate a blueprint as the blueprint is generated (e.g., drawn) and/or altered. The dynamic blueprint-evaluator evaluates computer-storable expressions that represent various criteria for the blueprint and can indicate when a criterion has not been meet (e.g., highlight a plan or a drawing). It will be appreciated that the dynamic blueprint-evaluator can be implemented as or as a part of software used to generated blueprints (e.g., a CAD tool), thereby allowing blueprints to be automatically and dynamically evaluated when a user (e.g., a human or application program) is in the process of creating or altering a blueprint. A dynamic blueprint-evaluator can, for example, be implemented as an interface or interface to software programs, applications or tools (e.g., a CAD). It is also possible to implement a blueprint-evaluator that adheres to a Building Information Model (e.g., IFC) and/or protocols (e.g., SML) that allow interoperability between diverse computing platforms (e.g., hardware and/or operating system).

Embodiments of these aspects of the invention are discussed below with reference to FIGS. 1A-6. However, those skilled in the art will readily appreciate that the detailed description given herein with respect to these figures is for explanatory purposes as the invention extends beyond these limited embodiments.

FIG. 1A depicts a computing environment 100 in accordance with one embodiment of the invention. FIG. 1A also illustrates generating and storing a storable-expression 101 into an exemplary computer readable medium, namely database 104. It should be noted that the storable-expression 101 effectively represents at least one criterion 106 (e.g., one or more rules, preferences, objectives, guidelines). The at least one criterion 106 can be associated, for example, with a blueprint (e.g., plan, map, idea, schema, strategy, layout) 108 as one or more criteria that the blueprint 108 can meet. In other words, the at least one criterion 106 can be one or more criteria defined for the blueprint 108.

As shown in FIG. 1A, an expression-generator 110 can receive the at least one criterion 106 as input and subsequently generate as output a storable-expression 101 that can be stored in the database 102 as data 102. Typically, the at least one criterion 106 is a text-based criterion, or can be represented as a text-based criterion expressed by, or in combination with, written characters or symbols. As such, the expression-generator 110 can, for example, be implemented as a computer program that automatically parses an input file (e.g., text-based file) that represents the at least one criterion 106 and subsequently generates the storable-expression 110 as output. However, it is also possible to manually generate the storable-expression 101 based on, for example, written text, a diagram, verbal communication, idea, or concept (e.g., diagram, verbal communication). As such, there is no need for the criterion 106 to be expressed in text or generated automatically. By way of example, a human may determine the storable-expression 112 based on a written role or code (e.g., building code), an idea or concept not previously expressed, or a diagram or verbal communication.

In any case, it should be noted that the storable-expression 101 can effectively represent a general or abstract criterion which may be applied to different blueprints as well as one which is specific to a particular blueprint. Referring to FIG. 1A, the storable-expression 101 includes at least one function ($F_1, \ldots, F_n$) and may optionally include at least one data-parameter (or parameter) ($P_1, \ldots, P_m$) and/or operators. It will be appreciated that the storable-expression 101 can be stored in the database 104 and/or be evaluated to determine whether the blueprint 108 meets the at least one criterion 106.

More particularly, referring back to FIG. 1A, a dynamic blueprint-evaluator (or dynamic agent) 120 can receive the storable-expression 101 or retrieve it as data 102 from the database 104. The dynamic blueprint-evaluator (or dynamic agent) 120 can also receive the blueprint 108 to determine whether it meets the at least one criterion 106 represented by the storable-expression 101. It will also be appreciated that the dynamic blueprint-evaluator 120 can dynamically evaluate the blueprint 100 as it is being generated or altered and interactively report the results, for example, to a user (e.g., a human or an application program) that is generating the blueprint.

FIG. 1B depicts a method 150 for representing at least one criterion for at least one blueprint in accordance with one embodiment of the invention. The method 150 can, for example, be used by the expression generator 110 shown in FIG. 1B. However, it is also possible that one or more operations can be performed manually by a human.

Initially, at least one criterion is received (152). It should be noted that the criterion can be evaluated for at least one blueprint in order to determine whether the blueprint meets the criterion. Next, a storable-expression for the at least one criterion is determined (154). The storable-expression includes at least one function that can be evaluated for at least one blueprint in order to determine whether the blueprint meets the at least one criterion (i.e., the criterion represented by the storable-expression). As will be described further below, the storable-expression can also include at least one parameter and/or at least one operator which can, for example, serve as input to the at least one function and determine or change the functionality performed by the function. It will be appreciated that one or more functions with one or more parameters and/or operators can collectively represent the at least one criterion received (152) and can be subsequently evaluated for a particular blueprint to determine whether the blueprint meets the criterion. After the storable-expression has been determined (154), it is determined (156) whether to store the storable-expression. If it is determined (156) not to store the storable-expression, method 150 ends. However, if it is determined (156) to store the storable-expression, the storable-expression is stored (158), for example, in a database before the method 150 ends.

Figure 1C:
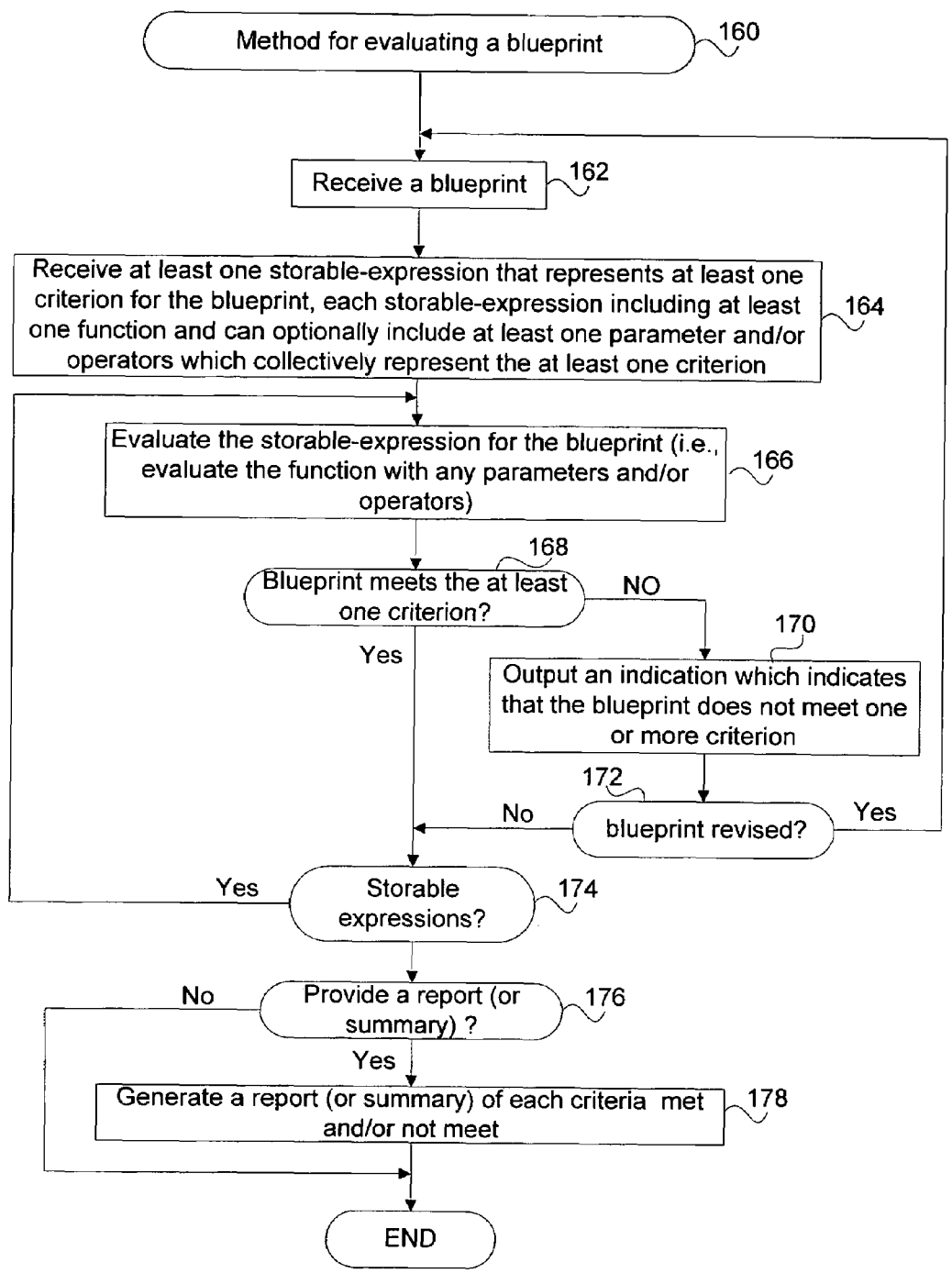
FIG. 1C depicts an evaluating method for evaluating a blueprint in accordance with one embodiment of the invention.

FIG. 1C depicts an evaluating method 160 for evaluating a blueprint in accordance with one embodiment of the invention. The evaluating method 160 can, for example, be used by the dynamic blueprint evaluator 120 shown in FIG. 1A. Initially, a blueprint is received (162). Next, at least one storable-expression associated with the blueprint is received (164). It should be noted that each storable-expression represents at least one criterion, includes at least one function, can officially include at least one parameter and/or operators. Accordingly, the storable-expression is evaluated (166). Typically, at least one function and one parameter are evaluated for the blueprint to determine whether the blueprint meets a criterion. After the storable-expression has been evaluated (166), it is determined (168) whether the blueprint meets the at least one criterion. If it is determined (168) that the blueprint does not meet the at least one criterion, an indication which indicates that the blueprint does not meet the at least one criterion is output (170). Thereafter, it is determined (172) whether the blueprint has been revised and a blueprint (i.e., a revised blueprint) can be received (162) accordingly. Subsequently, the evaluating method 160 proceeds as described above. On the other hand, if it is determined (172) that the blueprint has not been revised (172) or it is determined (168) that the blueprint meets the at least one criterion, the evaluating method 160 proceeds to determine (174) whether to evaluate more storable-expressions for the blueprint. If it is determined (174) to evaluate more expressions, at least one function and at least one parameter which collectively represent at least one criterion are evaluated (166). However, if it is determined that there are no more storable-expressions to evaluate, it is determined (176) whether to provide a report (or summary) of the criteria met (or not met) by the blueprint, and a report (or summary) can be generated (178) accordingly before the evaluating method 160 ends. The method 160 can also end if it is determined (176) not to generate a report. It will be appreciated by those skilled in the art that determining whether to provide a report can, for example, be made based on user input.

Figure 2A:
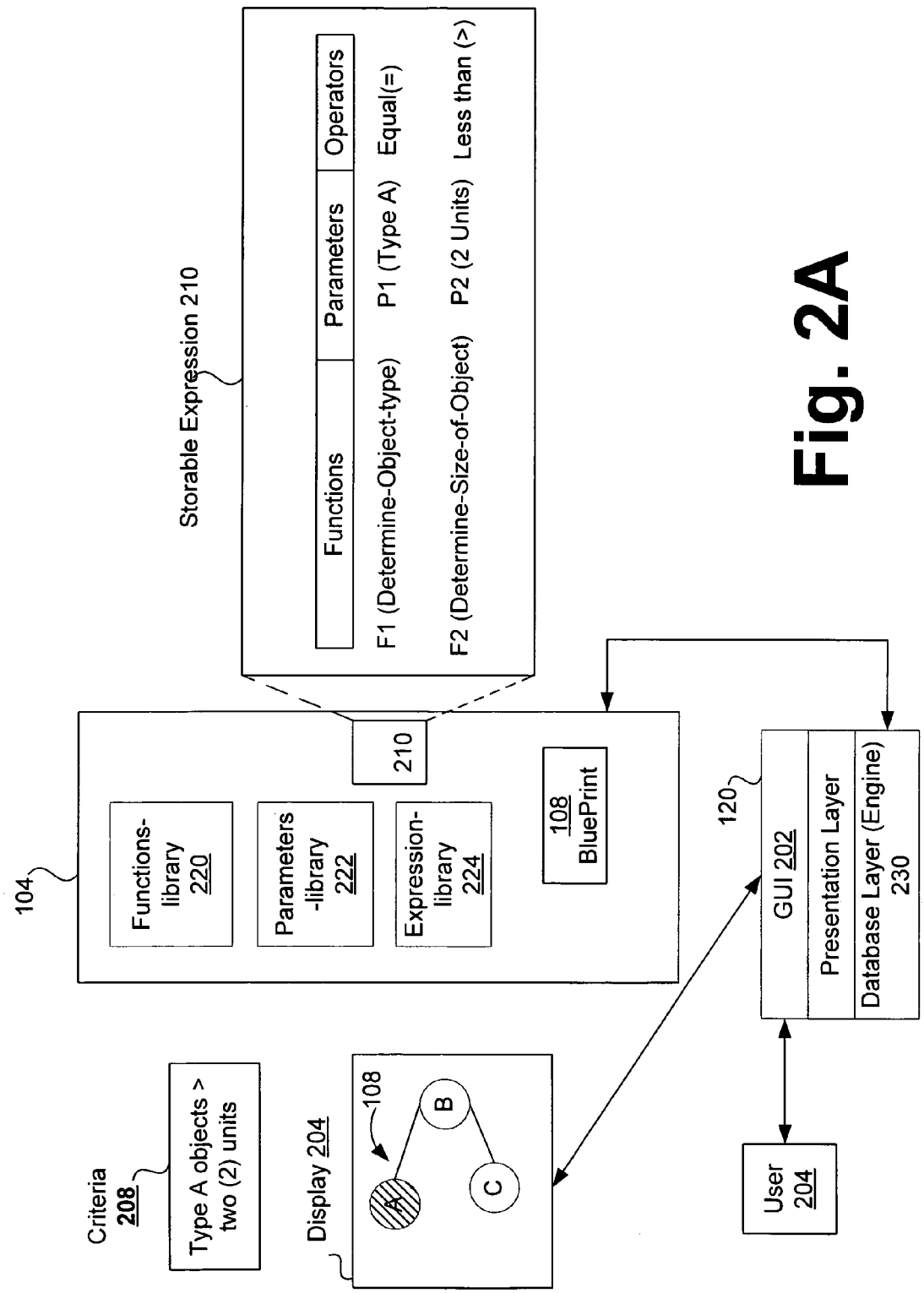
FIG. 2A depicts a dynamic blueprint-evaluator in greater detail in accordance with one embodiment of the invention.

Referring now to FIG. 2A, a dynamic blueprint-evaluator 120 is depicted in greater detail in accordance with one embodiment of the invention. It will be appreciated that the dynamic blueprint-evaluator 120 can, for example, be implemented as, or as a part of, a Computer Assisted Design (CAD) software tool capable of handling (two-dimensional, 2D) and/or (three-dimensional, 3D) designs for various models including Building Information Models (BIM) for building-plans.

As shown in FIG. 2A, a Graphical User Interface (GUI) 202 is provided as an interface for a user (e.g., a human) 204. The GUI 202 facilitates interacting with a display 204 that displays a blueprint 108 (e.g., building plan) for the user 204. The GUI 202 can, for example, be implemented as JAVA-based GUI. The blueprint 108 can be stored or subsequently stored in the database 104. The blueprint 108 can, for example, be an object-based blueprint and include a plurality of objects (e.g., doors, windows, walls). For simplicity, these objects are depicted as objects A, B and C on the display 204. It should be noted that objects A, B and C can be related in a relationship with each other (e.g., connected). In addition, the user 204 may interact with the GUI to manipulate these objects (e.g., add, delete, modify an object or a relationship between objects). Moreover, the dynamic blueprint-evaluator 120 can determine whether one or more objects (A, B and C respectively of object types A, B and C) in the blueprint 108 meet at least one criterion 208. The criterion 208 can, for example, be a general concept, rule, or preference that is applied to, various blueprints. By way of example, criterion 208 may be a rule that can be expressed in a textual form as "type A objects must be greater than 2 units." In any case, the criterion 208 is expressed as a storable-expression 210 that can be stored in the database 104.

As shown in FIG. 2A, the storable-expression 210 is comprised of functions, parameters and operators. These elements collectively represent the criterion 208. To further elaborate, a rule that "type A objects must be greater than 2 units," is expressed by function $F_1$ as a general, generic, and/or standard function for determining the type of an object, and a function $F_2$ which can be a general, generic and/or standard function for determining the size of an object. Further, functions $F_1$ and $F_2$ can be associated with parameters to construct a more complex expression that can be subsequently evaluated to determine whether the blueprint 108 (or one or more objects of the blueprint 108 or another blueprint) meets one or more criteria. More particularly, for function $F_1$, an abstract (or reference) parameter $P_1$, namely, "Type A" parameter can be combined with an equal ("=") operator to express determining whether an object is of "Type A."

It should be noted that the abstract (or reference) parameter represents or refers to actual data determined for a particular object when the expression is evaluated. In other words, abstract (or reference) parameter $P_1$ typically refers to actual data which is obtained for the object that is being evaluated and used to evaluate the expression. By way of example, when the function $F_1$ is evaluated in order to determine whether any object in the blueprint 108 is of "Type A," actual data types associated with objects A, B and C in the blueprint 108 are considered and compared with the abstract (or reference) parameter ("Type A") which in the case identifies a particular data type, namely data type A. In addition, the operator Equal (=) indicates that it should be determined whether the object is of type A. Accordingly, when the function $F_1$ is evaluated for the blueprint 108, it can be determined that the one object, namely, object A (displayed on display 206) matches the expression of whether an object is of "Type A." Subsequently, the remaining portion of the storable-expression 210 can be evaluated for object A of the blueprint 206 to determine whether the size of the object A is greater than 2 units (e.g., area greater than 2 cm$^2$). If the dynamic expression-evaluator 120 determines that object A is not greater than 2 units (i.e., the blueprint 108 does not meet the criterion 208), an indication can be made which indicates, for example, that object A does not meet the criterion 208 (e.g., highlight or red-mark object A).

It will be appreciated that user 204 may, for example, alter the object A (e.g., make it larger) and the dynamic blueprint evaluator 120 can interactively re-evaluate it and alert the user if the criterion 208 (or any other defined criterion) are not meet as the result of the alteration. This closely integrates verification and design of a blueprint and results in a much more cost effective process for producing blueprints that meet various criteria. In addition, the user's experience is greatly enhanced because it is possible to get virtually immediate feedback as the blueprint is being initially prepared an/or altered.

It will also be appreciated that the functions used to construct the storable-expression 210 can be stored in a functions-library 220 and used to construct various expressions for numerous types of blueprints. Similarly, a parameter-library 222 can store parameters that may be interchangeably combined with various functions stored in the functions-library 220. Those skilled in the art will appreciate it that in effect an infinite number of combinations can be generated by combining numerous functions stored in the functions-library 220 with numerous parameters stored in the parameters-library 222. This allows construction of almost an infinite number of expressions ranging from the very simple to the very complex. Furthermore, an expression-library 224 (e.g., a rule-library) may also be provided to store expressions (e.g., rules) for subsequent use. The libraries 220, 222 and 224 can be accessed by a database layer 230 that typically includes a database engine that facilitates accessing the database using a database access mechanism of protocol. As known by those skilled in the art, one such protocol is the Structured Query Language (SQL) which is a standard interactive and programming language for getting information from and updating a database. Although SQL is both an ANSI and an ISO standard, many database products support SQL with proprietary extensions to the standard language. Database queries can, for example, take the form of a command language that can select, insert, update, find out the location of data, and so forth.

Figure 2B:
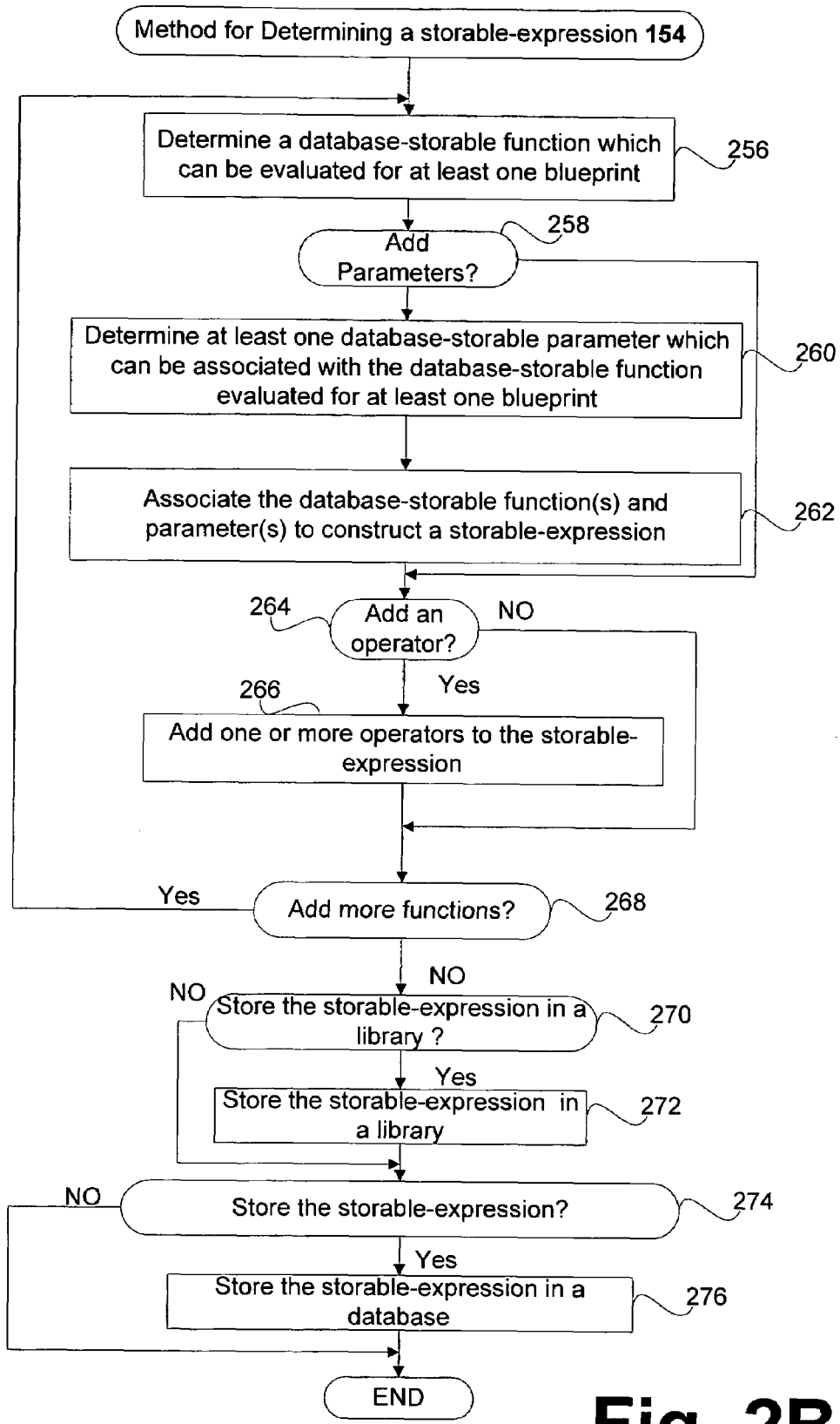
FIG. 2B depicts a method for determining a storable-expression in accordance with one embodiment of the invention.

FIG. 2B depicts a method 154 for determining a storable-expression in accordance with one embodiment of the invention. The storable-expression represents at least one criterion which can be associated with at least one blueprint. In other words, the storable-expression can be evaluated to determine whether the blueprint meets a criterion represented by the storable-expression. Initially, a database-storable function is determined (256). The function can, for example, be a general, generic, abstract, or standard function selected from a library stored in a database, or a function that is specifically determined for one or more criteria. Next, it is determined (258) whether to add one or more parameters and one or more parameters can be determined (260). Subsequently the at least one database-storable parameter can be determined and be associated (262) with the database-storable function. The database-storable parameter can, for example, be a parameter selected from a library of parameters, or one that is specifically determined for a particular function and/or criterion. In any case, the database storable function and parameter(s) are associated (262) with each other to construct a storable-expression. Thereafter, it is determined (264) whether to add at least one operator to the storable-expression. Accordingly, one or more operators can be added (266) to the storable-expression. Subsequently, it is determined (268) whether to add more functions and the method 154 can proceed in a similar manner to determine a database-storable function (256) and parameter (260), and so on.

On the other hand, if it is determined (258) not to add more functions, the storable-expression is effectively complete, and it is determined (270) whether to store the storable-expression in a library. Accordingly, the storable-expression can be stored (272). If it s determined (270) not to store the storable-expression in a library or after the storing it in a library (272), it is determined (274) whether to store the storable-expression in a database. Accordingly, the storable-expression can be stored (276) in a database and the method 154 ends. It should be noted that the stored expression can be associated with one or more blueprints and subsequently evaluated for them. The method 154 ends following the storing of the storable-expression in a database (276), or a determination (274) not to store the expression in a database.

Figure 2C:
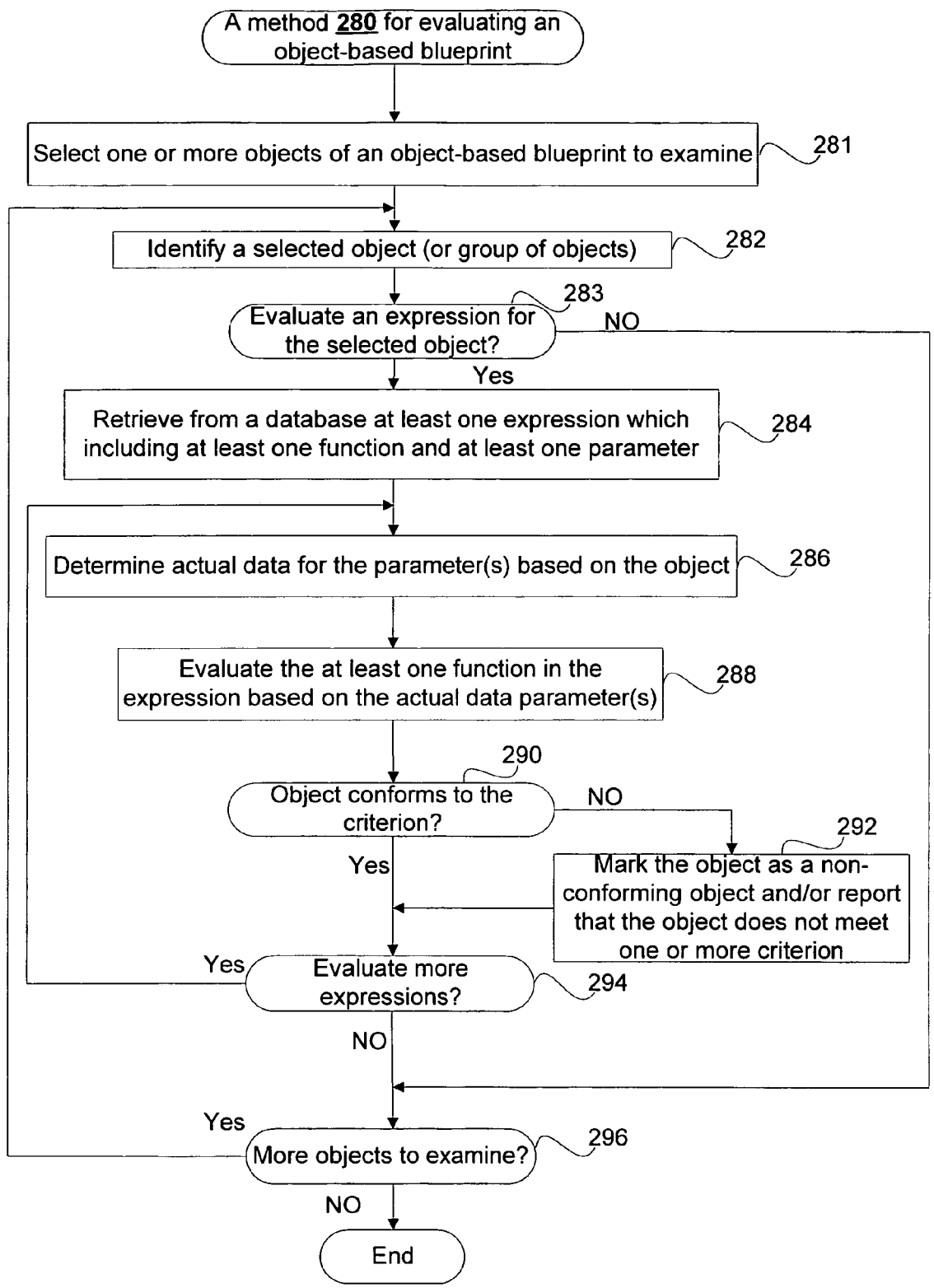
FIG. 2C depicts a method for evaluating an object-based blueprint in accordance with one embodiment of the invention.

FIG. 2C depicts a method 280 for evaluating an object-based blueprint in accordance with one embodiment of the invention. Initially, one or more objects of the object-based blueprints are selected (281). Next, a selected object (or group of objects) is (are) identified (282). Thereafter, it is determined (283) whether to evaluate an expression for the object (or group of objects) and at least one expression can be retrieved (284) from a database accordingly. Typically, the expression represents at least one criterion that is to be evaluated for the identified (282) object (or group of objects). It should be noted that the expression includes at least one function and at least one parameter in accordance with one embodiment of the invention. Accordingly, actual data for the parameter(s) is (are) determined (286) based on the object. By way of example, when a parameter indicates size or is a size measurement, the actual size of the object (or group of objects) can be determined (286). Next, at least one function of the expression is evaluated (288) based on the actual data determined (286) for the object. By way of example, the actual size of the object may be compared to the size indicated by a parameter (or reference parameter) in the expression (e.g., whether actual size of the object (2 units) is less than the size indicated by the reference parameter (4 units). As noted above, this determination may be based on one or more operators (e.g., equality, less than, and, or) after the evaluation (288) of the function with actual data determined based on the object, it is determined (290) whether the object conforms to the at least one criterion expressed by the expression. As will be known to those skilled in the art, a function can, for example, be evaluated to (or return) two possible values (e.g., true, false) to indicate whether one or more criteria have been met. In general, however, based on the result of the evaluation (290), it can be determined whether the one or more criteria represented by the function(s) and parameter(s) has been met by an object (or group of objects). Accordingly, the object may be marked (292) as a non-conforming object and/or it can be reported (292) that the object does not meet one or more criteria.

If it is determined (290) that the object conforms to the criterion expressed by the expression, or after the object has been marked (292) as non-conforming, the method 280 proceeds to determine (294) whether to evaluate more expressions for the object. If it is determined (294) that there are more expressions to evaluate, the method 280 proceeds to determine (286) actual data for the object and evaluate (290) at least one function based on the actual data. Similarly, if it is determined (296) that there are more objects to examine, an object is selected (282) and the method 280 proceeds in a similar manner as discussed above. The method 280 ends if it is determined (296) that there are no more objects to examine.

A dynamic blueprint-evaluator can, for example, evaluate building plans to determine whether building codes, government regulations, or other building criteria have been satisfied. This can be achieved by constructing expressions that represent various building criteria (e.g., building codes, regulations, or requirements). As noted above, these expressions can be constructed by using functions stored in a library in accordance with one embodiment of the invention. Referring to Table 1, an exemplary list of functions which are applicable to enforcing building codes, government regulations, or other criteria related to a building plans are listed. As will be appreciated by those skilled in the art, the functions outlined in Table 1 demonstrate general, generic, abstract and/or standard functions which can be used to perform measurements and other functions related to evaluating (or reviewing) building or architectural plans. For example, an "Exit Travel Distance" function can measure the distance between any occupied point in a plan for a building (or structure) to a point of exit (or exit). When the "Exit Travel Distance" function is evaluated the following exemplary operations can be performed: locate all objects in a BIM that are considered to be an "occupied point"; compare these objects with abstract (or reference) data (which can also be provided in a library, see FIG. 3A); compute the actual distance(s) for the objects and compare to the distance requirements indicated by the abstract (or reference) data; and display and/or store the results of the evaluation. It will be appreciated that these operations can be applied to various buildings or architectural plans. Further, these functions can interchangeably used with parameters that are also general, generic, abstract and/or standard.

TABLE 1

| | |
|---|---|
| Determining exit travel Distance | Determining type of construction |
| Determining interior versus exterior | Determining building element |
| Determining enclosure | Determining building element |
| Determining discharge volume | ratings |
| Determining occupant load | Determining building area |
| Determining door opening into path | Determining structural member |
| Determining width | Determining structural member |
| Determining height | ratings |
| Determining illumination | Determining structural member |
| Determining size | assembly |
| Determining swing | Determining wall |
| Determining elevation | Determining wall type |
| Determining locks & latches | Determining wall rating |
| Determining treads and risers | Determining wall penetration |
| | Determining smoke barrier |

In any case, a function in the functions-library can define a method, a procedure, or process for performing one or more operations. As such, parameters in a parameter-library can be considered to be input to the functions. These parameters can, for example, be stored in a simple form, a table, or in more complex forms (e.g., a parameter matrix).

Referring to FIG. 3B, a parameter matrix 320 is depicted in accordance with one embodiment of the invention. The parameter matrix 320 lists a few data parameters 322 used for the "Exit Travel Distance" function noted above. It should be noted that the "Exit Travel Distance" function can belong to a more generalized group, namely, distance-functions (or functions that relate to measuring distances). As shown in FIG. 3B, parameters category (or types) "Type," "Maximum Allowable Distance," and "Unit of Measurements" may be associated with the "Exit Travel Distance" function. In addition, under each of the parameter categories 322, several sub-categories can be identified (e.g., exterior exit doors at ground level, vertical exit enclosures).

It should be noted that the parameter (or reference) matrix 320 is effectively an abstract (or reference) matrix which can be used to generate an actual data matrix 340 (also shown in FIG. 3B). Actual data matrix 340 represents data which has been determined when the "Exit Travel Distance" function is evaluated for a particular blueprint or one or more of its objects. By way of example, the "Exit Travel Distance" for the parameter "Type" "Exit Passageways" can be determined to be "95" which is within the "Maximum Allowable Distance" (100) for an object identified as object "DR347" as indicated by the parameter (or reference) matrix 320.

FIG. 3C depicts a storable-representation 350 of a building rule which can, for example, correspond to a code compliance review of an ICC section "1003.2.3 Egress width" which states that "dwelling units of groups designated as R-2 and R-3 shall have door opening into the path of egress that is at least one-half of a required corridor width (e.g., 3 feet). As illustrated in FIG. 3C, this requirement can be expressed as a storable-expression outlined as sequences (001-007). It should be noted that each sequence (001-007) includes a function, a parameter and an operator.

To further elaborate, FIG. 4A illustrates how a traditional text-based building code (or regulation) may be stored. The traditional text-based building code 402 requires that "for flat ceilings, the distance between sprinklers for type 1 rating fire sprinklers must be 6 feet or less." Referring to FIG. 4B, the traditional text-based building code 402 may be expressed as an expression that includes a plurality of general, generic, abstract and/or standard functions (Function 1, Function 3, and Function 4) and similarly a plurality of general, generic, abstract and/or standard parameters (parameter 2, parameter 5 and parameter 6). As such these functions and parameters can be stored in a library and used interchangeably.

Referring now to FIG. 4C, a function can, for example, be implemented as: a "Type Object" function that determines the type of a function, a "Shape" function that determines the shape of a object, and so on. These functions can be mixed and matched with parameters" "Fire Sprinkler," "Ceiling," and so on.

FIG. 4D depicts a sequence (1-6) which can be stored to represent the traditional text-based code 402 shown in FIG. 4A. It should be appreciated that the functionality of the "Distance" function can be determined, or manipulated based on the parameters and/or operators it receives as demonstrated in FIG. 4D. The Distance Function may measure the distance between two objects when two parameters are received.

In view of the foregoing, it will be appreciated that a function-library (or library of functions) can include various functions (method or procedures) that perform general, generic, abstract, or standard operation(s). The generic functions can be used to construct various expressions that express different traditional text-based traditional building codes. Furthermore, these generic functions may be organized or categorized in various groups in a determined relationship (e.g., hierarchical relationship similar to that between classes of an object-based programming environment). By way of example, the functions may be divided into categories including a "performance-based function," and a "non-performance-based functions." Table 2 below lists a few exemplary general functions that can be provided for these categories of functions.

TABLE 2

Performance based functions:
   Sound Transmission. This function can be used to
      measure the impact of nearby traffic noise and sound
      passing on certain living space within a building
      measure of the impact of wall density to sound
      etc.
   Heat transmission. This function can be used to
      measure heat loss of a building
      measure of insulation to energy saving
      etc.
   Etc.
Non-Performance based functions:
   Distance function that measures distances between objects. This
   function can be used to
      measure the distance of doors to the nearest exit of a dwelling
      measure the fire sprinkler pipe away from the ceiling
      measure the height of hand-rail from the staircase
      etc.
   Flow function that measure flow volume. This function can be used to
      Measure water flow for fire sprinkler
      Measure Air circulation for an atrium
      etc.
   Rating function that identifies rating values of elements. This function
   can be used to
      Identify rating of I-Beams and compare with the rating
      requirement
      Identify the rating of the insulation material and compare with
      requirement
      Identify the fire rating of doors and compare with requirement
      etc.
   Shape function that measure shape of elements. This function can be
   used as
      A combination of distance function and shape function; such as
      if the shape of ceiling is not flat, then the distance between fire
      sprinklers must be at certain distance apart.
      The shape of sidewalk must allow for unobstructed access
      (disability access).
      etc.
Etc It will be apparent that an expression can be constructed and evaluated by a blueprint-evaluator for numerous applications, including, for example, architectural planning, architectural design, structural design, heating ventilation, air condition design, electrical design, material, costs & procurement, construction project schedule, automated plan review, inspection, building maintenance, and return on investment. Also a blueprint-evaluator can be implemented, for example, as an interface or interface with other existing software programs, applications or tools (e.g., a CAD). It is also possible to implement a blueprint-evaluator that adheres to a Building Information Model (e.g., IFC) and/or protocols (e.g., SML) that allow interoperability between diverse computing platforms (e.g., hardware and/or operating system). However, a blueprint-evaluator can be implemented independently of any specific Building Information Model (BIM), industry standard (e.g., IFC), or Model Building Codes (e.g., ICC), as it is possible to construct expressions and evaluate them independent of various models or protocols in accordance with the general, principals of the invention.

Accordingly, the invention can be implemented independent of any standard or protocol. Yet it will be appreciated that the invention can be implemented in compliance with industry standard building information models which are currently popular as well as those which may be developed in near future as the general concepts of the invention are independent of a particular model, a framework, or protocol.

Figure 5A:
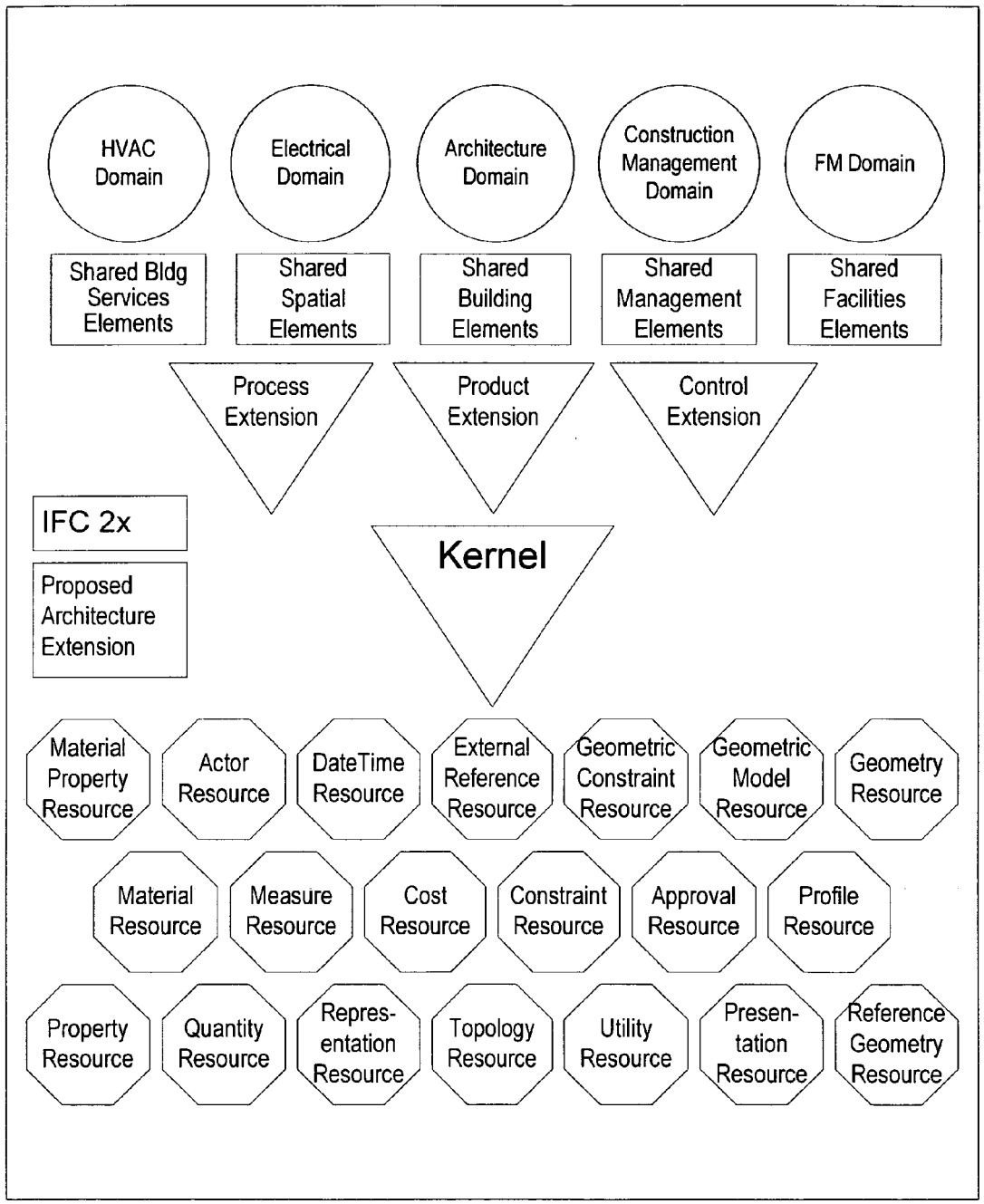
FIG. 5A depicts the IFC model version 2x.

Giving the popularity of the IFC model, functions and parameters which may be provided in accordance with the current IFC model version 2x will be further discussed below. FIG. 5A depicts the IFC model version 2x which is known to those skilled in the art.

FIG. 5B depicts a few exemplary elements within the IFC model. Those skilled in the art will know that use of a "type specification" in the IFC model generally allows information to be defined once and reused. This concept is similar to the way that CAD system use symbols.

Figure 5D:
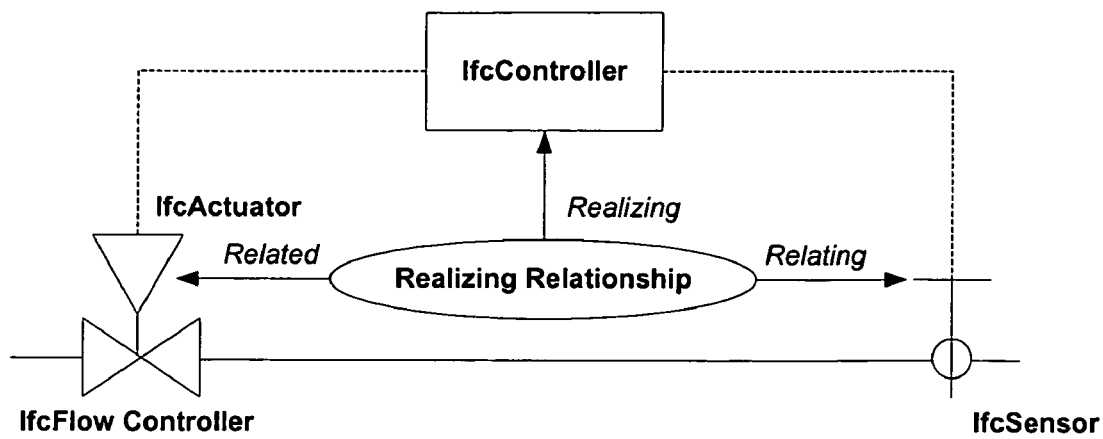

FIG. 5C depicts some exemplary elements within the IFC model. These elements include fire protection elements 510 (e.g., sprinklers, hose reels, hydrants wt/dry rising mains), electrical elements 512 (e.g., provision of switches, switchgear, power and communication outlets, transformers, generators, motors, conductors, protective devices, distribution centers, light fittings), time series elements (e.g., time related events), brackets and fasteners elements (e.g., brackets, drop rods, steel sections, bracket assemblies, screws, bolts etc.). As depicted in FIG. 5D, the IFC model also provides a general purpose capability that enables relationships between IFC models to be defined. This capability can be used, for example, to connect or control various objects.

Referring back to FIG. 5A which depicts a "type specification" in the IFC model, it should be noted that a generic, general, standard, or abstract function can be generated to identify types for all elements (or objects) in an IFC compliant model. This generic function can, for example, identify the type of an element according to attributes associated with the object (e.g., attributes 1-3). This function can be generic because it can determine the type of an element based on one or more attributes associated with the element. However, it will be appreciated that by pairing a function with a parameter (e.g., in a matrix), a generic function may be effectively transformed to a more specific function that performs a more specific function in accordance with the parameter used. By way of example, when the generic function for determining types (e.g., type object) is used for a particular element (e.g., equipment A) as a parameter, then the generic function would determine the type based on a particular attribute (e.g., attribute 3). Similarly, a generic "properties function" can be created to evaluate properties of elements (or objects) defined in the IFC model. By way of example, when the generic "properties function" receives "Equipment A" as a parameter, the generic "properties function" is evaluated based on two properties that are associated with "Equipment A" elements. Likewise, a generic "spatial function" can be defined for evaluating distance, location, or space of elements defined in an IFC compliant model. Similarly, when the generic "spatial function" receives an "Equipment A" element, then the spatial function is evaluated based on occurrences at (X, Y, Z) coordinates. This also applies to the operations that can be combined with the function and parameter. In general, a generic function may be transformed to a more specific function based on the parameter and/or operators associated with the function.

Figure 6:
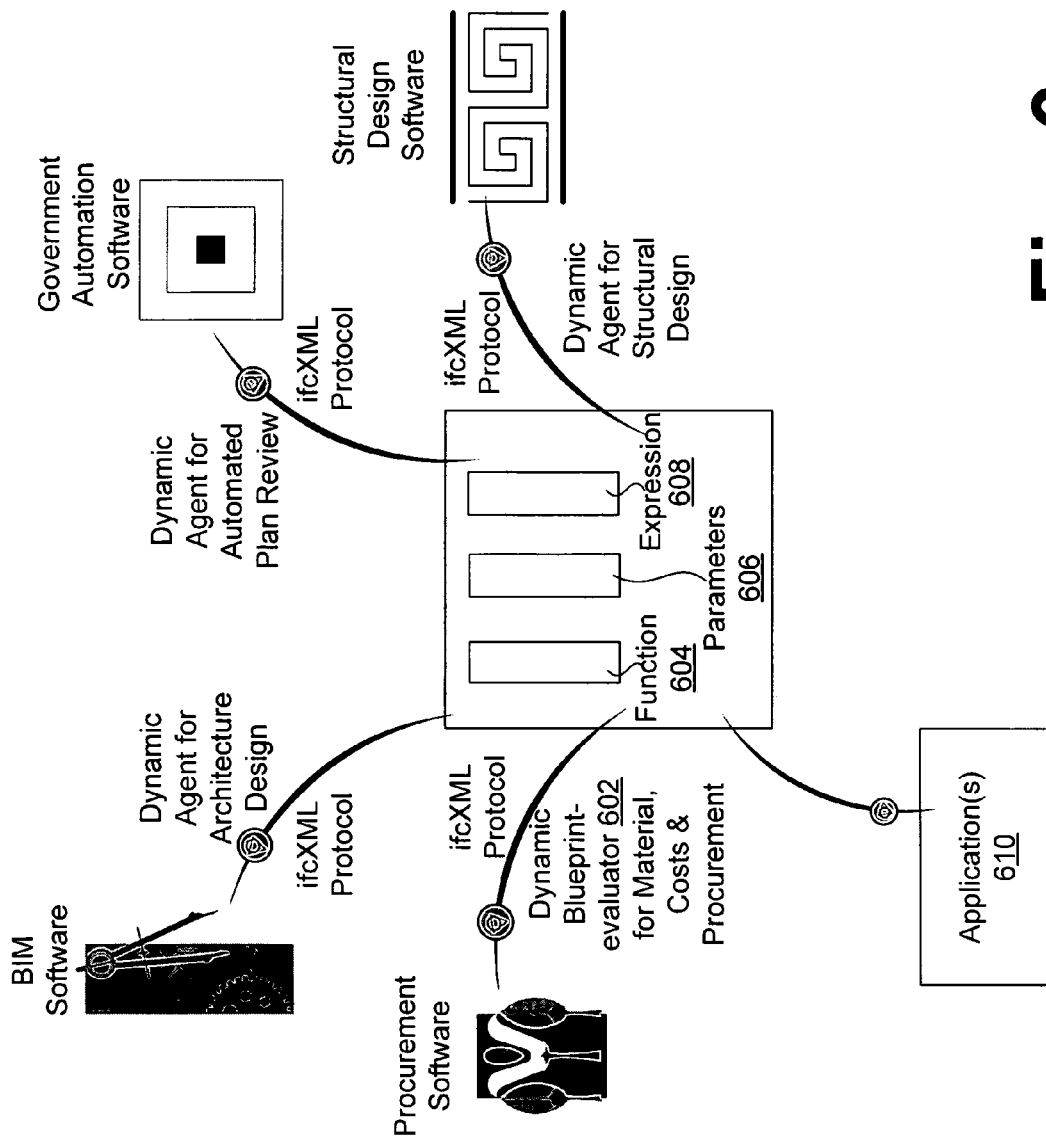
FIG. 6 depicts a dynamic blueprint-evaluator interacting with various types of software using a set of functions and parameters used to construct a set of expressions.

As noted above, a dynamic blueprint-evaluator can interactively be used for various applications and/or interface with various other computer products (e.g., software programs). FIG. 6 depicts a dynamic blueprint-evaluator 600 interacting with various types of software using a set of functions 604 and parameters 606 used to construct a set of expressions (e.g., building codes or regulations) 608. The expressions 608 can effectively represent various criteria for different blueprints developed in BIM, procurement, government automation, structural design software, or other applications 610, for example, in an IFC environment.

The invention has many advantages. One or more embodiments of the invention may have one or more of the following advantages. One advantage of the invention is that is possible to store various evaluation criteria as computer-readable expressions that can be subsequently used to evaluate different blueprints. Another advantage of the invention is that blueprints can be automatically and interactively evaluated. Yet another advantage of the invention is that it is possible to store in one or more libraries generic (general, abstract, or standard) functions and parameters that can be interchangeably matched to construct expressions representing various criteria. Still another advantage is that the invention can be implemented independent of any specific Building Information Model (BIM), industry standard (e.g., IFC), or Model Building Codes (e.g., ICC), yet it is possible to adhere to these models if desired.

The many features and advantages of the present invention are apparent from the written description, and thus, it is intended by the appended claims to cover all such features and advantages of the invention. Further, since numerous modifications and changes will readily occur to those skilled.

What is claimed is:

1. A computer-implemented method of representing at least one criterion as a computer-storable expression that can be stored and evaluated for a blueprint in order to determine whether said blue print meets said at least one criterion, said method comprising:

receiving or determining at least one criterion, wherein said at least one criterion can represent at least one criterion for at least one blueprint;

determining or receiving at least one function associated with said at least one criterion, wherein said at least one function is configured for evaluation of said at least one blueprint;

determining, at least partially based on said at least one function, at least one storable-expression for said at least one criterion, wherein said at least one storable-expression represents said at least one criterion for evaluation of said at least one blueprint to determine whether said at least one blueprint meets said at least one criterion, and wherein said at least one storable-expression includes said at least one function; and storing said at least one storable-expression in a computer readable medium, thereby effectively providing a stored representation of said at least one criterion for subsequent evaluation of said at least one blueprint in order to determine whether said at least one blueprint meets said at least one criterion.

2. A computer-implemented method as recited in claim 1, wherein said method further comprises:

determining or receiving at least one parameter which can be associated with said at least one function, wherein said at least one function and said at least one parameter can collectively represent said at least one storable-expression, wherein said computer readable medium is primary or secondary memory, a storage device, or a database.

3. A computer-implemented method as recited in claim 2, wherein said at least one storable-expression further includes: said at least one parameter, said at least one function, and at least one operator which defines an operation for said at least one storable-expression.

4. A computer-implemented method as recited in claim 2, wherein said at least one storable-expression is stored in an expression-library that can be accessed by said computing system.

5. A computer-implemented method as recited in claim 1, wherein said determining of at least one function comprises:
    selecting said at least one function from a plurality of functions that can be used to construct one or more storable-expressions.

6. A computer-implemented method as recited in claim 5, wherein said determining of said at least one storable-expression for said at least one criterion comprises:
    selecting said at least one parameter from a plurality of parameters which can be used to construct one or more storable-expressions.

7. A computer-implemented method as recited in claim 6, wherein said plurality of functions and parameters can be interchangeably combined with each other to construct one or more storable-expressions.

8. A computer-implemented method as recited in claim 2, wherein said method further comprises:
    determining whether to store said at least one storable-expression in an expression-library; and
    storing said at least one storable-expression of said at least one criterion in said expression-library when said determining determines to store said at least one storable-expression in said expression-library.

9. A computer-implemented method as recited in claim 2, wherein said determining of said at least one storable-expression comprises:
    selecting said least one function from a functions-library that includes a plurality of functions that can be used to construct one or more storable-expressions.

10. A computer-implemented method as recited in claim 1, wherein said determining of said at least one storable-expression comprises:
    selecting at least one parameter from a parameters-library that includes a plurality of parameters that can be combined with said at least one function to construct one or more storable-expressions.

11. A computer-implemented method as recited in claim 1, wherein said method further comprises:
    selecting said at least one function from a functions-library that includes a plurality of functions that can be used to construct one or more storable-expressions;
    selecting said at least one parameter from a parameters-library that includes a plurality of parameters that can be combined with said at least one function to construct one or more storable-expressions;
    determining whether to store said at least one storable-expression in an expression-library; and
    storing said at least one storable-expression of said at least one criterion in said expression-library when said determining determines to store said at least one storable-expression in said expression-library.

12. A computer-implemented method as recited in claim 1, wherein said determining of said at least one storable-expression comprises:
    selecting said at least one storable-expression from an expression-library that stores a plurality of storable-expressions that each represent at least one criterion for at least one blueprint.

13. A computer-implemented method as recited in claim 1, wherein said determining of said at least one storable-expression comprises:
    determining whether an expression-library stores said at least one storable-expression, wherein said expression-library stores a plurality of storable-expressions that each represent at least one criterion for at least one blueprint;
    selecting said at least one storable-expression from said expression-library when said determining determines that said expression-library stores said at least one storable-expression;
    performing one or more of the following operations when said determining determines that said expression-library does not store said at least one storable-expression:
        (a) selecting said at least one function from a functions-library that includes a plurality of functions that can be used to construct said storable-expression;
        (b) selecting said at least one parameter from a parameters-library that includes a plurality of parameters that can be combined with said at least one function to construct said at least one storable-expression;
        (c) determining whether to store said at least one storable-expression in an expression-library; and
        (d) storing said at least one storable-expression in said expression-library when said determining determines to store said at least one storable-expression in said expression-library.

14. A computer-implemented method as recited in claim 1,
    wherein said at least one blueprint is one or more of the following:
        an idea, a plan, a project, a map, a design, a scheme, a strategy, a layout, a schema, or an outline; and
    wherein said at least one criterion includes and/or corresponds to one or more of the following:
        a rule, a regulation, or a preference.

15. A computer-implemented method as recited in claim 1,
    wherein said at least one blueprint is a building or architectural plan that is IFC-based and/or compliant with the IFC standard, and
    wherein said at least one criterion includes and/or corresponds to a rule or a regulation for a building or architectural plan.

16. A computer system, wherein said computing system comprises one or more processors that are configured and/or operable to:
    determine at least one storable-expression that represents at least one criterion for at least one blueprint;
    store said at least one storable-expression in a computer readable medium; retrieve said at least one storable-expression from said computer-readable medium and wherein said at least one storable-expression includes at least one function for evaluation of said at least one blueprint to determine whether said at least one blueprint meets said at least one criterion, thereby storing a representation of said at least one criterion for subsequent evaluation of said at least one blueprint in order to determine whether said at least one blueprint meets said at least one criterion.

17. A computer system, wherein said computer system comprises one or more processors that are configured and/or operable to:
  determine at least one storable-expression that represents at least one criterion for at least one blueprint,
  store said at least one storable-expression in a computer readable medium;
  retrieve said at least one storable-expression from said and wherein said at least one storable-expression includes at least one function for evaluation of said at least one blueprint to determine whether said at least one blueprint meets said at least one criterion, thereby storing a representation of said at least one criterion for subsequent evaluation of said at least one blueprint in order to determine whether said at least one blueprint meets said at least one criterion;
  access a functions-library that includes a plurality of functions for constructing said at least one storable-expression; and
  access a parameters-library that includes a plurality of parameters, wherein one or more of said plurality of parameters can be combined with said at least one function to construct said at least one storable-expression.

18. A computer system as recited in claim 17, wherein said one or more processors are further configured and/or operable to access an expression-library that stores said at least one storable-expression.

19. A computer system as recited in claim 18, wherein said expression-library includes a database that can be accessed using the Structured Query Language (SQL).

20. A computer system as recited in claim 17,
  wherein said plurality of functions in said functions-library include a set of general functions which can be evaluated for a plurality of blueprints;
  wherein said plurality of parameters in said parameters-library include a set of general parameters which can be evaluated for a plurality of blueprints.

21. A computer system as recited in claim 20,
  wherein each general function in said sets of generic functions can be combined with one or more of said general parameters to construct a storable-expression.

22. A computer system as recited in claim 17, wherein said at least one criterion is a rule or regulation for a building or an architectural plan.

23. A computer system as recited in claim 17,
  wherein said at least one blueprint is a building or an architectural plan,
  wherein said at least one criterion is a rule or regulation for a building or an architectural plan, and
  wherein said at least one function is a function that can be evaluated for said building or architectural plan.

24. A computer system as recited in claim 23, wherein said at least one function can be one or more of the following:
  a function for sound transmission, a function for heat transmission, a function for determining distance, a function for determining flow, a function for determining rating of elements, a function for measuring shape of elements.

25. A computer system as recited in claim 24, wherein said at least one function and at least one parameter are represented in a parameter matrix.

26. A computer system as recited in claim 23, wherein said at least one blueprint is object-based and adheres to a Building Information Model (BIM).

27. A computer system as recited in claim 26, wherein said at one or more processors are further configured and/or operable to:
  receive said at least one blueprint;
  evaluate said at least one function for said at least one blueprint; and
  determine based on said evaluating whether said at least one blueprint meets said at least one criterion.

28. A computer system as recited in claim 26, wherein said Building Information Model (BIM) is compliant with an Industry Foundation Class (IFC) model.

29. A computer system as recited in claim 17, wherein said computer system is further operable to effectively construct said at least one storable-expression from one or more functions stored in said functions-library.

30. A computer system as recited in claim 17, wherein said computer system is further operable to effectively construct said at least one storable-expression from one or more parameters stored in said parameters-library.

31. A computer readable medium, comprising:
  computer program code that when executed stores a functions-library including a plurality of functions for constructing at least one storable-expression, wherein said at least one storable-expression represents at least one criterion for evaluation of said at least one blueprint based on one or more functions of said functions-library in order to determine whether said at least one blueprint meets said at least one criterion; computer program code that when executed stores said at least one storable-expression in said computer readable medium and wherein said at least one storable-expression includes at least one function of said plurality of functions for evaluation of said at least one blueprint to determine whether said at least one blueprint meets said at least one criterion, thereby effectively providing a stored representation of said at least one criterion for subsequent evaluation of said at least one blueprint in order to determine whether said at least one blueprint meets said at least one criterion.

32. A computer readable medium as recited in claim 31, further comprising:
  computer program code that stores a parameters-library that includes a plurality of parameters, wherein one or more of said plurality of parameters can be combined with said at least one function to construct said at least one storable-expression.

33. A computer-implemented method of evaluating a blueprint, said method comprising:
  receiving, identifying and/or determining said at least one blueprint;
  receiving, identifying and/or determining at least one storable-expression, wherein said at least one storable-expression represents at least one criterion for evaluation of said at least one blueprint to determine whether said at least one blueprint meets said at least one criterion, and wherein said at least one storable-expression includes at least one function for evaluation of said at least one blueprint to determine whether said at least one blueprint meets said at least one criterion;
  storing said at least one storable-expression in a computer readable medium;
  evaluating the at least one function for said at least one blueprint; and
  determining based on said evaluating whether said at least one blueprint meets said at least one criterion; and
  outputting an indication that indicates whether said at least one blueprint meets said at least one criterion or not based on said determining of whether said at least one blueprint meets said at least one criterion.

34. A computer-implemented method as recited in claim 33, wherein said receiving of said at least one storable-expression comprises one or more of the following:
retrieving said at least one storable-expression from said computer readable medium; and
receiving said at least one storable-expression via a wireless mode of transmission.

35. A computer-implemented method as recited in claim 34,
wherein said at least one storable-expression further includes at least one parameter which can be associated with said at least one function, wherein said at least one function and said at least one parameter can collectively represent said at least one storable-expression; and
wherein said method further comprises:
determining actual data for said at least one blueprint based on said at least one parameter;
evaluating said at least one function based on said actual data.

36. A computer-implemented method as recited in claim 35, wherein said at least one storable-expression is retrieved from an expression-library.

37. A computer-implemented method as recited in claim 33, wherein said at least one blueprint is one or more of the following:
an idea, a plan, a project, a map, a design, a scheme, a strategy, a layout, a schema, or an outline.

38. A computer-implemented method as recited in claim 37,
wherein said at least one blueprint is a building or architectural plan, and
wherein said at least one criterion is a rule or a regulation for a building or architectural plan.

39. A computer-implemented method as recited in claim 38, further comprising:
outputting an indication that indicates said at least one blueprint has not met said at least one criterion when said determining determines that said at least one blueprint does not meet said at least one criterion.

40. A computer-implemented method as recited in claim 39, further comprising
determining whether said at least one blueprint has been altered; and
reevaluating said at least one blueprint when said determining operates to determine that said at least one blueprint has been altered.

41. A computing system comprising one or more processors configured and/or operable to effectively provide a blueprint-evaluator for evaluating blueprints, wherein said blueprint-evaluator operates to receive, identify and/or determine at least one storable-expression and store said at least one storable-expression, wherein said at least one storable-expression represents at least one criterion for evaluation of said at least one blueprint to determine whether said at least one blueprint meets said at least one criterion, thereby effectively providing a stored representation of said at least one criterion for subsequent evaluation of said at least one blueprint in order to determine whether said at least one blueprint meets said at least one criterion.

42. A computing system as recited in claim 41,
wherein said at least one storable-expression includes at least one function which can be evaluated for said at least one blueprint to determine whether said at least one blueprint meets said at least one criterion, and
wherein said at least one storable-expression further includes at least one parameter which can be associated with said at least one function, wherein said at least one function and said at least one parameter can collectively represent said at least one storable-expression.

43. A computing system as recited in claim 42, wherein said blueprint-evaluator further operates to:
evaluate the at least one function for said at least one blueprint; and
determine based on said evaluating whether said at least one blueprint meets said at least one criterion.

44. A computing system as recited in claim 42, wherein said blueprint-evaluator operates to:
determine whether said blueprint has been altered; and
reevaluate said at least one function or another function after said at least one blueprint has been altered.

45. A computing system as recited in claim 44, wherein said blueprint-evaluator can be used to generate or alter said at least one blueprint.

46. A computing system as recited in claim 44,
wherein said blueprint-evaluator provides a graphical user interface that can be used by a user to interact with blueprint-evaluator in order to generate or alter said at least one blueprint.

47. A computing system as recited in claim 45,
wherein said user is a human being, and
wherein said method further comprises: informing said user via said graphical user interface whether at least one criterion represented by said at least one function has been met.

48. A computing system as recited in claim 46, wherein said informing informs said user as said at least one blueprint is being generated or altered, thereby providing said user with feedback as said at least one blueprint is being generated or altered.

49. A computing system as recited in claim 44,
wherein said at least one blueprint is an object-based blueprint that is compatible with a building model, and
wherein said blueprint-evaluator includes a Computerized Aid Design (CAD) capability for generating building and architectural plans.

50. An apparatus for evaluating object-based building or architectural plans that are compatible and/or compliant with a building model, said apparatus comprising:
at least one processor; and
memory which stores at least one determined storable-expression, wherein said at least one determined storable-expression represents at least one building or architectural criterion for evaluation of at least one building or architectural plan to determine whether said at least one building or architectural plan meets said at least one building or architectural criterion, and wherein said at least one determined storable-expression includes at least one function for evaluation of said at least one blueprint to determine whether said at least one blueprint meets said at least one criterion, thereby effectively providing a stored representation of said at least one criterion for evaluation of said at least one blueprint in order to determine whether said at least one blueprint meets said at least one criterion.

51. An apparatus as recited in claim 50,
wherein said at least one storable-expression further includes at least one parameter which can be associated with said at least one function, wherein said at least one function and said at least one parameter can collectively represent said at least one storable-expression, and wherein said processor operates to:
- evaluate said at least one function for said at least one building or architectural plan; and
- determine based on said evaluating whether said at least one building or architectural plan blueprint meets said at least one building or architectural criterion.

52. An apparatus as recited in claim 50, further comprising:
- a display for displaying said at least one building or architectural plan blueprint;
- a Graphical User Interface for interfacing with a user.

53. A computer readable medium including computer program code, said computer readable medium comprising:
- computer program code executable for storing at least one expression that represents at least one criterion associated with at least one blueprint, wherein said at least one expression includes at least one function for evaluation of said at least one blueprint to determine whether said at least one blueprint meets said at least one criterion, thereby effectively providing a stored representation of said at least one criterion for subsequent evaluation of said at least one blueprint in order to determine whether said at least one blueprint meets said at least one criterion.

54. A computer readable medium as recited in claim 53, wherein said computer readable medium further comprises:
- computer program code for receiving and/or at least one expression.

55. A computer readable medium including computer program code executable for evaluating a blueprint, said computer readable medium comprising:
- computer program code for receiving at least one blueprint;
- computer program code for receiving or determining at least one expression, wherein said at least one expression represents at least one criterion for evaluation of said at least one blueprint to determine whether said at least one blueprint meets said at least one criterion, wherein said at least one expression is stored in a computer readable medium,
- computer program code for evaluating said at least one expression for said at least one blueprint; and
- computer program code for determining based on said evaluating whether said at least one blueprint meets said at least one criterion; and
- computer program code for outputting an indication that indicates whether said at least one blueprint meets said at least one criterion or not based on said determining of whether said at least one blueprint meets said at least one criterion.

56. A computer readable medium including computer program code executable for representing at least one criterion as an expression, said computer readable medium comprising:
- computer program code for determining, identifying and/or receiving at least one storable-expression for at least one criterion associated with at least one blueprint, wherein said at least one storable-expression represents said at least one criterion for evaluation of said at least one blueprint to determine whether said at least one blueprint meets said at least one criterion; and
- computer program code for storing said at least one storable-expression, thereby effectively providing a stored representation of said at least one criterion for subsequent evaluation of said at least one blueprint in order to determine whether said at least one blueprint meets said at least one criterion.

* * * * *